(12) United States Patent
Furuya et al.

(10) Patent No.: US 12,392,033 B2
(45) Date of Patent: Aug. 19, 2025

(54) SUBSTRATE PROCESSING APPARATUS AND SUBSTRATE PROCESSING METHOD

(71) Applicant: Tokyo Electron Limited, Tokyo (JP)

(72) Inventors: Yuichi Furuya, Yamanashi (JP); Masamichi Hara, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 18/255,407

(22) PCT Filed: Dec. 1, 2021

(86) PCT No.: PCT/JP2021/044135
§ 371 (c)(1),
(2) Date: Jun. 1, 2023

(87) PCT Pub. No.: WO2022/130985
PCT Pub. Date: Jun. 23, 2022

(65) Prior Publication Data
US 2024/0093362 A1     Mar. 21, 2024

(30) Foreign Application Priority Data
Dec. 15, 2020   (JP) .................................. 2020-207526

(51) Int. Cl.
*C23C 16/44*    (2006.01)
*C23C 16/16*    (2006.01)
*C23C 16/52*    (2006.01)

(52) U.S. Cl.
CPC .......... *C23C 16/4412* (2013.01); *C23C 16/16* (2013.01); *C23C 16/52* (2013.01)

(58) Field of Classification Search
CPC .................................................... C23C 16/52
See application file for complete search history.

(56) References Cited

U.S. PATENT DOCUMENTS

| | | | | |
|---|---|---|---|---|
| 2002/0094277 | A1* | 7/2002 | Gaudet | F04D 15/0066 417/44.1 |
| 2005/0120955 | A1* | 6/2005 | Yamasaki | C23C 16/16 118/715 |
| 2006/0222768 | A1 | 10/2006 | Faguet | |
| 2013/0000558 | A1* | 1/2013 | Hara | C23C 16/4412 118/724 |
| 2014/0295675 | A1* | 10/2014 | Ikeuchi | H01L 21/67109 118/704 |

FOREIGN PATENT DOCUMENTS

| | | |
|---|---|---|
| CN | 102112206 | 6/2011 |
| JP | H04-059393 U | 5/1992 |

(Continued)

*Primary Examiner* — Austin Murata
(74) *Attorney, Agent, or Firm* — IPUSA, PLLC

(57) ABSTRACT

A substrate processing apparatus according to an aspect of the present disclosure is an apparatus that deposits a film on a substrate disposed in a processing chamber, and includes a process gas supply configured to supply, into the processing chamber, a process gas including a source gas and a carrier gas that carries the source gas, a vacuum pump configured to exhaust an interior of the processing chamber, and a purge gas supply configured to supply a purge gas into the vacuum pump. The purge gas includes a first gas that is identical to the carrier gas.

10 Claims, 3 Drawing Sheets

(56) References Cited

FOREIGN PATENT DOCUMENTS

| | | |
|---|---|---|
| JP | 2000-277503 | 10/2000 |
| JP | 2002-134498 | 5/2002 |
| JP | 2006-339461 | 12/2006 |
| JP | 2008-244298 | 10/2008 |
| TW | 200716778 | 5/2007 |
| WO | 2004/007797 | 1/2004 |

* cited by examiner

SUBSTRATE PROCESSING APPARATUS AND SUBSTRATE PROCESSING METHOD

TECHNICAL FIELD

The present disclosure relates to a substrate processing apparatus and a substrate processing method.

BACKGROUND ART

In order to prevent corrosion or film deposition in a turbo molecular pump, a technique of introducing an inert gas into an exhaust system during operation of the pump is known (for example, see Patent Document 1). Additionally, a technique of depositing a Ru film by supplying $Ru_3(CO)_{12}$ gas into a processing chamber, using CO gas as a carrier gas is known (for example, see Patent Document 2).

RELATED-ART DOCUMENTS

Patent Document

[Patent Document 1] Japanese Unexamined Utility Model Application Publication No. H4-59393
[Patent Document 2] Japanese Unexamined Patent Application Publication No. 2008-244298

SUMMARY OF THE INVENTION

Problem to be Solved by the Invention

The present disclosure provides a technique of suppressing adhesion of a film to the interior of a vacuum pump.

Means for Solving Problem

A substrate processing apparatus according to an aspect of the present disclosure is an apparatus that deposits a film on a substrate disposed in a processing chamber, and includes a process gas supply configured to supply, into the processing chamber, a process gas including a source gas and a carrier gas that carries the source gas, a vacuum pump configured to exhaust an interior of the processing chamber, and a purge gas supply configured to supply a purge gas into the vacuum pump. The purge gas includes a first gas that is identical to the carrier gas.

Effect of Invention

According to the present disclosure, adhesion of a film to the interior of a vacuum pump can be suppressed.

DESCRIPTION OF EMBODIMENTS

In the following, non-restrictive embodiments of the present disclosure will be described with reference to the accompanying drawings. In all of the accompanying drawings, the same or corresponding members or components are denoted by the same or corresponding reference symbols, and duplicated description is omitted.

[Substrate Processing Apparatus]

Figure 1:
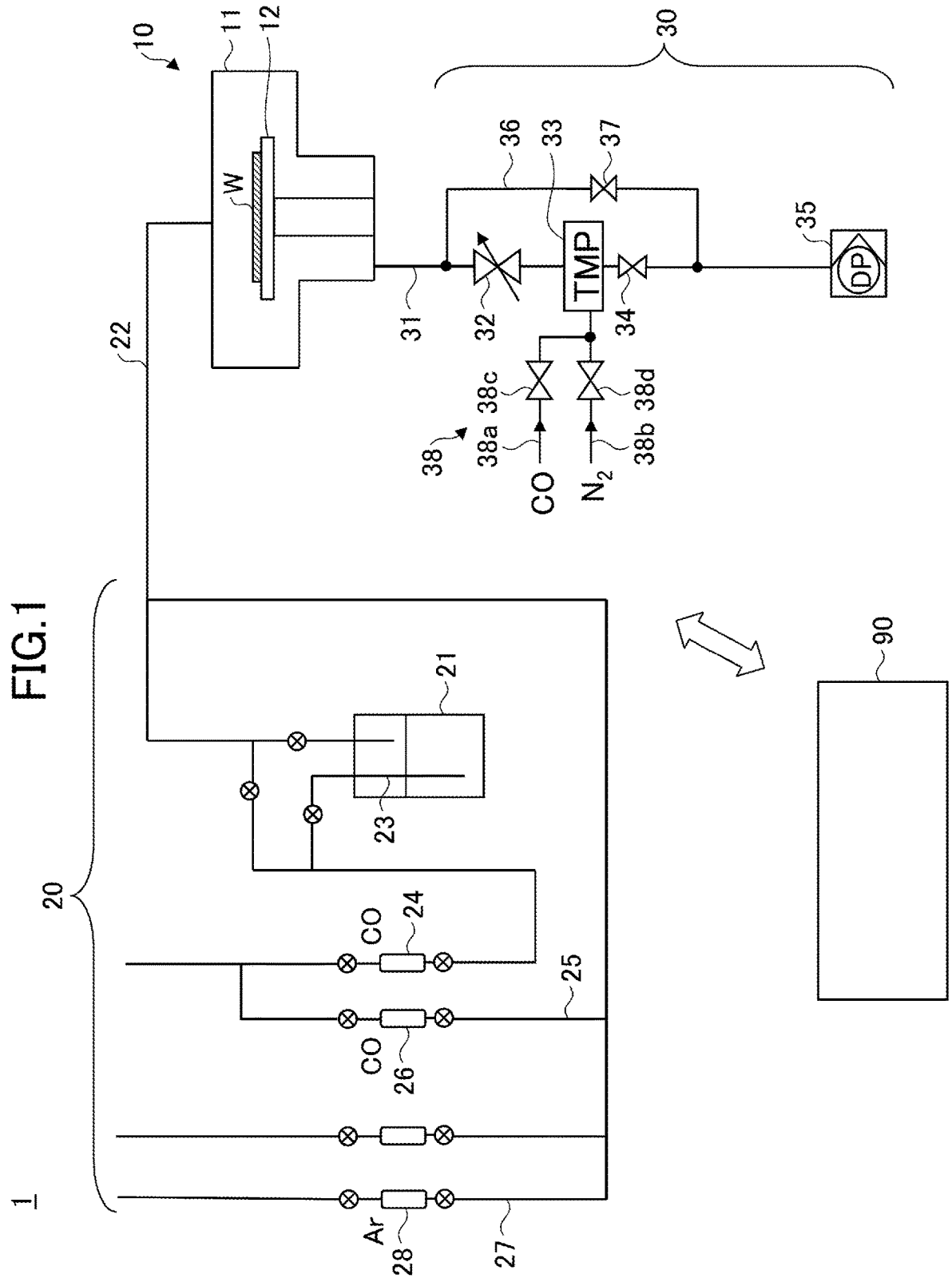
FIG. 1 is a schematic view illustrating an example of a substrate processing apparatus according to an embodiment.

An example of a substrate processing apparatus according to an embodiment will be described with reference to FIG. 1. In the following, as an example of the substrate processing apparatus, a substrate processing apparatus configured to deposit a ruthenium (Ru) film by a chemical vapor deposition (CVD) method will be described.

A film deposition apparatus 1 includes a processing section 10, a process gas supply 20, an exhaust section 30, and a controller 90.

The processing section 10 performs a film deposition process of depositing a Ru film on a substrate W. The substrate W may be, for example, a semiconductor wafer. The processing section 10 includes a processing chamber 11 and a mounting table 12. The interior of the processing chamber 11 is depressurized by the exhaust section 30. The mounting table 12 is provided in the processing chamber 11. The mounting table 12 holds the substrate in the processing chamber 11.

The process gas supply 20 supplies $Ru_3(CO)_{12}$ gas, which is an example of a source gas, to the processing section 10. The process gas supply 20 includes a source container 21, a gas introduction line 22, a bubbling gas line 23, and a flow rate controller 24. The $Ru_3(CO)_{12}$ is stored in the source container 21. The bubbling gas line 23 supplies, to the source container 21, carbon monoxide (CO) gas whose flow rate is controlled by the flow rate controller 24. This causes the $Ru_3(CO)_{12}$ to be vaporized in the source container 21, and the $Ru_3(CO)_{12}$ gas is supplied into the processing chamber 11 through the gas introduction line 22. Additionally, the process gas supply 20 includes a carrier gas line 25 and a flow rate controller 26. The carrier gas line 25 supplies CO gas, which is an example of a carrier gas whose flow rate is controlled by the flow rate controller 26, to the gas introduction line 22, and carries the $Ru_3(CO)_{12}$ gas into the processing chamber 11. Additionally, the process gas supply 20 includes a purge line 27 and a flow rate controller 28. The purge line 27 supplies an inert gas, such as argon (Ar), whose flow rate is controlled by the flow rate controller 28 into the processing chamber 11 through the gas introduction line 22.

The exhaust section 30 exhausts the interior of the processing chamber 11. The exhaust section 30 includes an exhaust line 31, a pressure control valve 32, a turbo molecular pump 33, a valve 34, and a dry pump 35. The pressure control valve 32, the turbo molecular pump 33, the valve 34, and the dry pump 35 are provided in the exhaust line 31 in this order from the processing chamber 11 side. Additionally, the exhaust section 30 includes a bypass line 36 that connects a portion between the processing chamber 11 and the pressure control valve 32 in the exhaust line 31 and a portion between the valve 34 and the dry pump 35 in the exhaust line 31 and that bypasses the turbo molecular pump 33. The bypass line 36 is used when the interior of the processing chamber 11 is roughly evacuated by the dry pump 35. The bypass line 36 is provided with a valve 37. Additionally, the exhaust section 30 includes a purge gas supply 38. The purge gas supply 38 supplies a purge gas into the turbo molecular pump 33. The purge gas supply 38 includes a CO gas line 38a and a $N_2$ gas line 38b. The CO gas line 38a supplies CO gas into the turbo molecular pump 33. The $N_2$ gas line 38b supplies $N_2$ gas into the turbo molecular pump 33. The CO gas line 38a and the $N_2$ gas line are respectively provided with valves 38c and 38d. By opening the valve 38c and closing the valve 38d, CO gas is supplied from the CO gas line 38a into the turbo molecular pump 33. Conversely, by closing the valve 38c and opening the valve 38d, $N_2$ gas is supplied from the $N_2$ gas line 38b into the turbo molecular pump 33.

The controller 90 controls the processing section 10, the process gas supply 20, and the exhaust section 30 to perform a substrate processing method of the embodiment to be described later. The controller 90 may be, for example, a computer.

[Turbo Molecular Pump]

An example of a turbo molecular pump (TMP) of the embodiment will be described with reference to FIG. 2. A turbo molecular pump 100 described below is applicable as the turbo molecular pump 33 of the film deposition apparatus 1 described above.

The turbo molecular pump 100 includes a casing 101, a base 102, a motor housing 103, bearings 104 and 105, a shaft 106, a rotor 107, a pump mechanism 108, an oil tank 109, an inlet flange 110, an exhaust flange 111, and a purge gas supply 120.

The casing 101 is a cylindrical body. The casing 101 accommodates the motor housing 103 and the like.

The base 102 supports the casing 101.

The motor housing 103 is provided in the casing 101 and fixed on the base 102. A motor M that rotationally drives the shaft 106 is accommodated in the motor housing 103.

The bearings 104 and 105 are respectively provided in the motor housing 103 and the base 102. The bearings 104 and 105 are paired. The bearings 104 and 105 may be, for example, ball bearings or magnetic bearings.

The shaft 106 is supported by the bearings 104 and 105 at the vicinity of both axial ends.

The rotor 107 is fixed to the shaft 106 to be integrally rotatable, and accommodates the motor housing 103 inside an inner circumferential surface 107a.

The pump mechanism 108 includes a turbine 108a and a screw rotor 108b. The turbine 108a and the screw rotor 108b are provided between an outer circumferential surface 107b of the rotor 107 and an inner circumferential surface 101a of the casing 101. The turbine 108a is formed by alternately arranging a rotating blade 107c projecting from the rotor 107 and a fixed blade 101b projecting from the inner circumferential surface 101a of the casing 101. The screw rotor 108b is formed by inserting a blade 101c projecting from the inner circumferential surface 101a of the casing 101 into a spiral groove 107d formed on the outer circumferential surface of the lower end portion of the rotor 107 in a non-contact and close manner.

The oil tank 109 is attached to the bottom of the base 102.

The inlet flange 110 is fixed to an upper end of the casing 101. The inlet flange 110 includes an inlet port 110a through which gas is suctioned.

The exhaust flange 111 is fixed to the bottom of the base 102. The exhaust flange 111 includes an exhaust port 111a for exhausting the gas suctioned from the inlet port 110a.

The purge gas supply 120 supplies the purge gas into the motor housing 103. In one embodiment, the purge gas supply 120 supplies the purge gas from a lower side to an upper side along the outer circumferential surface of the shaft 106 (see arrow F in FIG. 2). The purge gas supply 120 includes a CO gas supply 121 and a $N_2$ gas supply 122.

The CO gas supply 121 includes a CO gas supply source 121a, a gas line 121b, a flow rate controller 121c, a valve 121d, and the like. The CO gas supply 121 supplies, into the motor housing 103, the CO gas supplied from the CO gas supply source 121a by the flow rate controller 121c controlling the flow rate.

The $N_2$ gas supply 122 includes a $N_2$ gas supply source 122a, a gas line 122b, a flow rate controller 122c, a valve 122d, and the like. The $N_2$ gas supply 122 supplies, into the motor housing 103, the $N_2$ gas supplied from the $N_2$ gas supply source 122a by the flow rate controller 122c controlling the flow rate.

The purge gas supply 120 controls the opening and closing of the valves 121d and 122d to switch the purge gas to be supplied into the motor housing 103 between CO gas and $N_2$ gas.

In the turbo molecular pump 100 described above, the gas suctioned from the inlet port 110a is compressed by the pump mechanism 108 and forcibly exhausted toward the exhaust port 111a.

Figure 2:
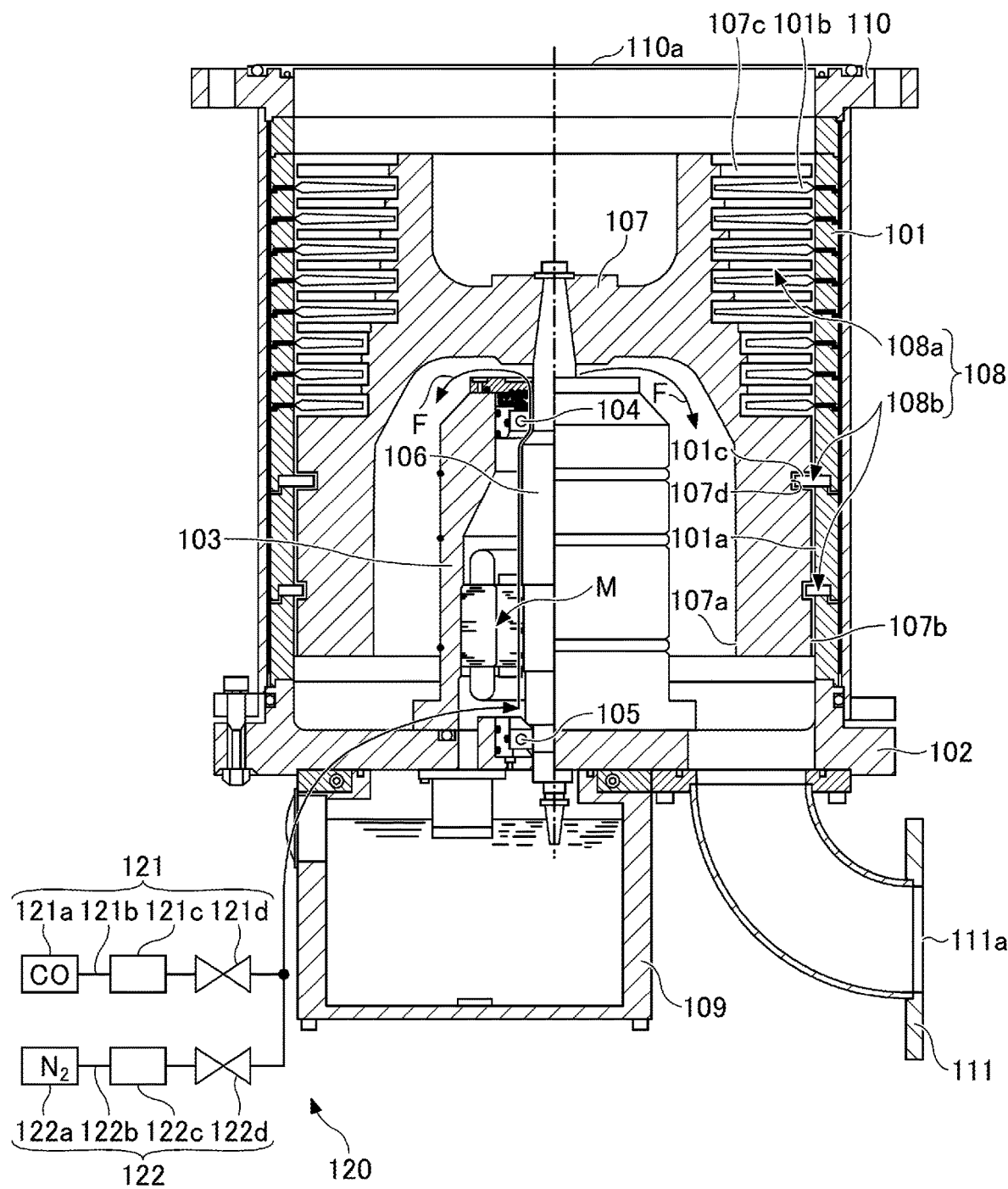
FIG. 2 is a schematic cross-sectional view illustrating an example of a turbo molecular pump of the embodiment.

Here, in the example illustrated in FIG. 2, an embodiment in which the purge gas supply 120 supplies the purge gas into the motor housing 103 has been described, but the present invention is not limited thereto. The purge gas supply 120 may be configured to supply the purge gas to another place in the turbo molecular pump 100.

[Substrate Processing Method]

Figure 3:
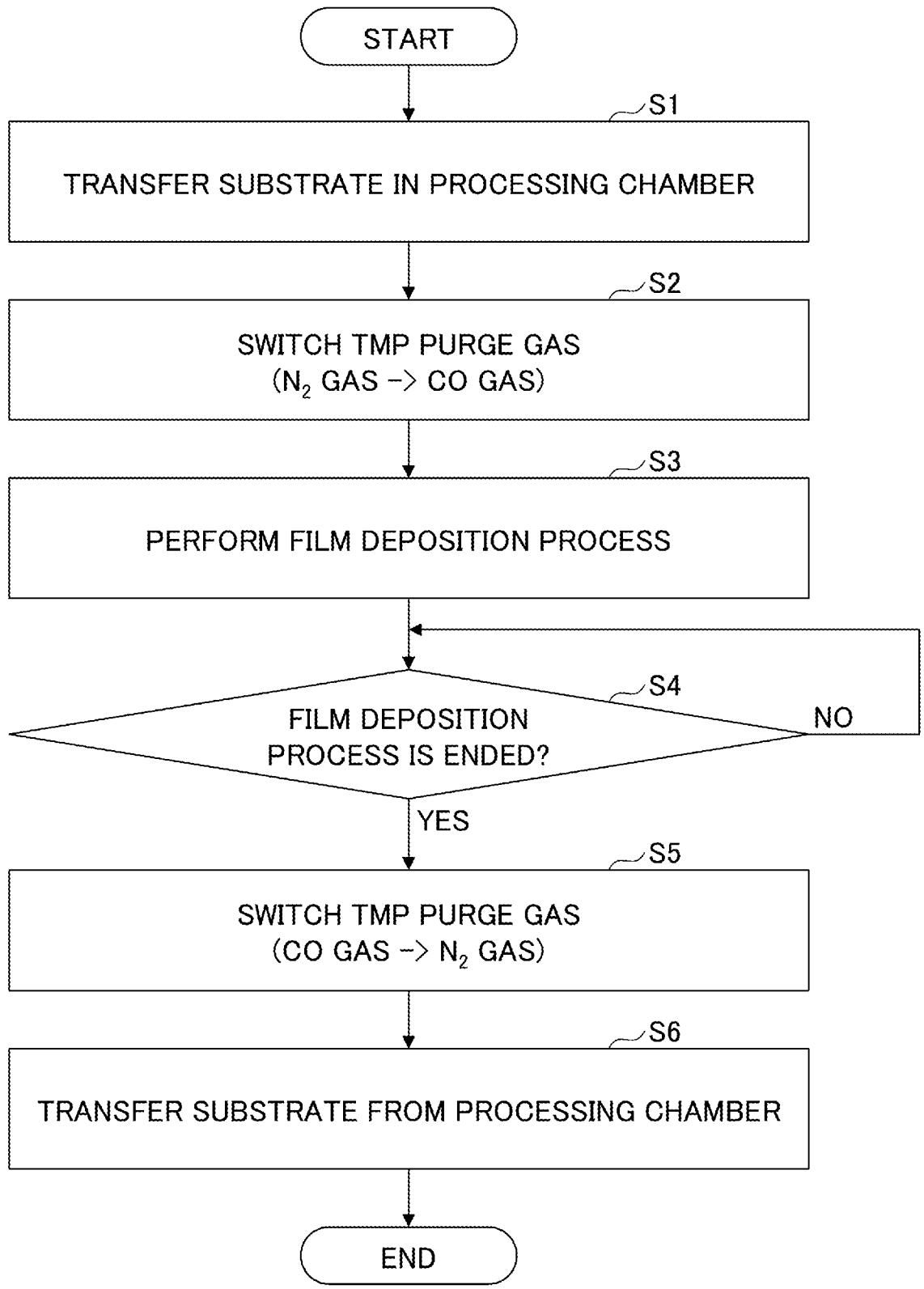
FIG. 3 is a diagram illustrating an example of a substrate processing method of the embodiment.

An example of the substrate processing method of the embodiment will be described with reference to FIG. 3. In the following, a case where a Ru film is deposited on the substrate W in the above-described film deposition apparatus 1 will be described as an example. Here, the valve 38c is in a closed state and the valve 38d is in an open state at the time of the start of the following substrate processing method. That is, it is assumed that $N_2$ gas is supplied as the purge gas into the turbo molecular pump 33 at the time of the start of the substrate processing method.

In step S1, the controller 90 controls each component of the film deposition apparatus 1 to transfer the substrate W into the processing chamber 11 and mount the substrate W on the mounting table 12.

Step S2 is performed after step S1. However, step S2 may be performed before step S1, or may be performed simultaneously with step S1. In step S2, the controller 90 switches the purge gas to be supplied into the turbo molecular pump 33 from $N_2$ gas to CO gas. In one embodiment, the controller 90 stops the supply of $N_2$ gas into the turbo molecular pump 33 by closing the valve 38d and starts the supply of CO gas into the turbo molecular pump 33 by opening the valve 38c.

Step S3 is performed after step S2. However, the step S3 may be performed simultaneously with the step S2. In step S3, the controller 90 controls each component of the film deposition apparatus 1 to perform the film deposition process on the substrate W mounted on the mounting table 12 in the processing chamber 11. In one embodiment, the controller 90 controls the process gas supply 20 to supply $Ru_3(CO)_{12}$ gas into the processing chamber 11 together with CO gas, thereby depositing the Ru film on the substrate W. Additionally, part of the $Ru_3(CO)_{12}$ gas supplied into the processing chamber 11 is not used in the film deposition process and exhausted by the turbo molecular pump 33. At this time, because CO gas is supplied as the purge gas into the turbo molecular pump 33, $Ru_3(CO)_{12}$ gas is exhausted together with CO gas.

Step S4 is performed after step S3. In step S4, the controller 90 determines whether the film deposition process is completed. If it is determined in step S4 that the film deposition process is completed, the controller 90 advances the process to step S5. If it is determined in step S4 that the film deposition process is not completed, the controller 90 performs step S4 again.

Step S5 is performed after step S4. In step S5, the controller 90 switches the purge gas to be supplied into the turbo molecular pump 33 from CO gas to $N_2$ gas. In one embodiment, the controller 90 stops the supply of CO gas into the turbo molecular pump 33 by closing the valve 38c, and starts the supply of $N_2$ gas into the turbo molecular pump 33 by opening the valve 38d. As described above, by switching the purge gas from CO gas to $N_2$ gas after the film deposition process is completed, the cost can be reduced by reducing the consumption of CO gas.

Step S6 is performed after step S5. However, step S6 may be performed simultaneously with step S5, or may be performed before step S5. In step S6, the controller 90 controls each component of the film deposition apparatus 1 to transfer the substrate W that is mounted on the mounting table 12 and on which the film deposition process has been performed, from the processing chamber 11. Subsequently, the controller 90 ends the process.

The $Ru_3(CO)_{12}$ compound is decomposed by a reaction represented by the following formula (A) to cause deposition of metal Ru.

$$Ru_3(CO)_{12} \rightarrow 3Ru + 12CO \qquad (A)$$

The reaction represented by the formula (A) advances more as the partial pressure of CO in the atmosphere decreases. Therefore, when part of the $Ru_3(CO)_{12}$ gas is exhausted by the exhaust section 30 with no reaction in the processing chamber 11 during the film deposition process, $Ru_3(CO)_{12}$ gas may be decomposed in the turbo molecular pump 33, piping on the downstream side thereof, and the like and may be deposited as a Ru film. It is conceivable that this is because the $N_2$ gas supplied as the purge gas into the turbo molecular pump 33 reduces the CO concentration in the atmosphere.

With respect to the above, according to the substrate processing method of the embodiment, the purge gas to be supplied into the turbo molecular pump 33 is switched from $N_2$ gas to CO gas before the film deposition process is started. Thereby, even when part of the $Ru_3(CO)_{12}$ gas is exhausted by the exhaust section 30 with no reaction in the processing chamber 11 during the film deposition process, a decrease in the CO concentration in the atmosphere in the turbo molecular pump 33, the piping on the downstream side thereof, and the like can be suppressed. Therefore, the decomposition reaction of the $Ru_3(CO)_{12}$ in the turbo molecular pump 33, the piping on the downstream side thereof, and the like is suppressed, so that the deposition of the Ru film in the turbo molecular pump 33, the piping on the downstream side thereof, and the like can be suppressed.

Additionally, during the film deposition process, it is preferable to supply CO gas into the turbo molecular pump 33 such that the partial pressure ratio of $Ru_3(CO)_{12}$ gas to CO gas becomes 1:49 or greater. This can suppress the deposition of the Ru film in the turbo molecular pump 33, the piping on the downstream side thereof, and the like, thereby preventing the generation of particles.

Here, in the above-described embodiments, CO gas is an example of a first gas, and $N_2$ gas is an example of a second gas. Additionally, the turbo molecular pumps 33 and 100 are examples of a vacuum pump, and the valves 38c, 38d, 121d, and 122d are examples of a gas switcher.

It should be understood that the embodiments disclosed herein are illustrative and are not restrictive in all respects. The above-described embodiments may be omitted, replaced, and changed in various forms without departing from the scope and spirit of the appended claims.

Although the case where CO gas and $N_2$ gas are supplied into the turbo molecular pump 33 has been described in the above-described embodiments, the present disclosure is not limited thereto. For example, another inert gas such as Ar gas may be used instead of $N_2$ gas.

The present international application is based upon and claims the priority to Japanese Patent Application No. 2020-207526 filed on Dec. 15, 2020, the entire contents of which are incorporated herein by reference.

DESCRIPTION OF REFERENCE SYMBOLS 1 film deposition apparatus
10 processing section
11 processing chamber
20 process gas supply
30 exhaust section
33, 100 turbo molecular pump
38, 120 purge gas supply
W substrate

The invention claimed is:

1. A substrate processing apparatus that deposits a film on a substrate disposed in a processing chamber, the substrate processing apparatus comprising:
a process gas supply configured to supply a process gas into the processing chamber, the process gas including a source gas and a carrier gas that carries the source gas;
a vacuum pump configured to exhaust an interior of the processing chamber; and
a purge gas supply configured to supply a purge gas into the vacuum pump,
wherein the purge gas includes a first gas that is identical to the carrier gas,
wherein the purge gas includes a second gas that is different from the first gas, and
wherein the purge gas supply includes a gas switcher configured to switch between a state of supplying the first gas into the vacuum pump and a state of supplying the second gas into the vacuum pump.

2. The substrate processing apparatus as claimed in claim 1, further comprising a controller,
wherein the controller is configured to control the purge gas supply to supply the first gas into the vacuum pump in a case where the process gas is supplied from the process gas supply into the processing chamber.

3. The substrate processing apparatus as claimed in claim 1, further comprising a controller,
wherein the controller is configured to control the purge gas supply to supply the second gas into the vacuum pump in a case where the process gas is not supplied from the process gas supply into the processing chamber.

4. The substrate processing apparatus as claimed in claim 1, wherein the second gas is an inert gas.

5. The substrate processing apparatus as claimed in claim 1, wherein the vacuum pump is a turbo molecular pump and the purge gas supply supplies the purge gas along a shaft of the turbo molecular pump.

6. The substrate processing apparatus as claimed in claim 1, wherein the source gas is Ru3(CO)12 gas, and the carrier gas and the first gas are CO gas.

7. The substrate processing apparatus as claimed in claim 1, wherein the purge gas supply supplies the purge gas into the vacuum pump such that a partial pressure ratio of the source gas to the first gas becomes 1:49 or greater.

8. A substrate processing method that deposits a film on a substrate disposed in a processing chamber, the substrate processing method comprising:

supplying a process gas into the processing chamber while exhausting, by a vacuum pump, an interior of the processing chamber, the process gas including a source gas and a carrier gas that carries the source gas;

wherein the supplying of the process gas includes supplying a purge gas into the vacuum pump, the purge gas including a first gas that is identical to the carrier gas, wherein the purge gas includes a second gas that is different from the first gas, and wherein the supplying of the purge gas includes switching between a state of supplying the first gas into the vacuum pump and a state of supplying the second gas into the vacuum pump.

9. A substrate processing apparatus that deposits a film on a substrate disposed in a processing chamber, the substrate processing apparatus comprising:

a process gas supply configured to supply a process gas into the processing chamber, the process gas including a source gas and a carrier gas that carries the source gas;

a vacuum pump configured to exhaust an interior of the processing chamber;

a purge gas supply configured to supply a purge gas into the vacuum pump; and a controller, wherein the purge gas includes a first gas that is identical to the carrier gas, wherein the purge gas includes a second gas that is different from the first gas, and wherein the controller is configured to control the purge gas supply to supply the first gas into the vacuum pump in a case where the process gas is supplied from the process gas supply into the processing chamber.

10. A substrate processing apparatus that deposits a film on a substrate disposed in a processing chamber, the substrate processing apparatus comprising:

a process gas supply configured to supply a process gas into the processing chamber, the process gas including a source gas and a carrier gas that carries the source gas;

a vacuum pump configured to exhaust an interior of the processing chamber;

a purge gas supply configured to supply a purge gas into the vacuum pump; and a controller, wherein the purge gas includes a first gas that is identical to the carrier gas, wherein the purge gas includes a second gas that is different from the first gas, and wherein the controller is configured to control the purge gas supply to supply the second gas into the vacuum pump in a case where the process gas is not supplied from the process gas supply into the processing chamber.

* * * * *